United States Patent
Ananthakrishnan et al.

(10) Patent No.: US 10,248,181 B2
(45) Date of Patent: Apr. 2, 2019

(54) ENABLING A NON-CORE DOMAIN TO CONTROL MEMORY BANDWIDTH IN A PROCESSOR

(71) Applicant: Intel Corporation, Santa Clara, CA (US)

(72) Inventors: Avinash N. Ananthakrishnan, Portland, OR (US); Inder M. Sodhi, Folsom, CA (US); Efraim Rotem, Haifa (IL); Doron Rajwan, Rishon Le-Zion (IL); Eliezer Weissmann, Haifa (IL); Ryan Wells, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 132 days.

(21) Appl. No.: 15/381,241

(22) Filed: Dec. 16, 2016

(65) Prior Publication Data

US 2017/0097668 A1    Apr. 6, 2017

Related U.S. Application Data

(63) Continuation of application No. 15/138,505, filed on Apr. 26, 2016, which is a continuation of application
(Continued)

(51) Int. Cl.
*G06F 1/32* (2006.01)
*G06F 1/324* (2019.01)
(Continued)

(52) U.S. Cl.
CPC ............ *G06F 1/324* (2013.01); *G06F 1/3203* (2013.01); *G06F 1/3293* (2013.01);
(Continued)

(58) Field of Classification Search
CPC .................................... G06F 1/26; G06F 1/30
(Continued)

(56) References Cited

U.S. PATENT DOCUMENTS 5,163,153 A    11/1992    Cole et al.
5,287,292 A    2/1994    Kenny et al.
(Continued)

FOREIGN PATENT DOCUMENTS

CN    101351759 A    1/2009
CN    101403944 A    4/2009
(Continued)

OTHER PUBLICATIONS

Taiwan Intellectual Property Office, Office Action dated Nov. 2, 2015 in Taiwan Patent Application No. 103146274.
(Continued)

*Primary Examiner* — Raymond N Phan
(74) *Attorney, Agent, or Firm* — Trop, Pruner & Hu, P.C.

(57) ABSTRACT

In one embodiment, the present invention includes a processor having multiple domains including at least a core domain and a non-core domain that is transparent to an operating system (OS). The non-core domain can be controlled by a driver. In turn, the processor further includes a memory interconnect to interconnect the core domain and the non-core domain to a memory coupled to the processor. Still further, a power controller, which may be within the processor, can control a frequency of the memory interconnect based on memory boundedness of a workload being executed on the non-core domain. Other embodiments are described and claimed.

20 Claims, 5 Drawing Sheets

Related U.S. Application Data

No. 14/451,807, filed on Aug. 5, 2014, now Pat. No. 9,354,692, which is a continuation of application No. 13/282,896, filed on Oct. 27, 2011, now Pat. No. 8,832,478.

(51) Int. Cl.
```
G06F 1/3293    (2019.01)
G06F 1/3203    (2019.01)
G11C 7/22      (2006.01)
G06F 13/42     (2006.01)
G06F 1/3296    (2019.01)
G06F 13/40     (2006.01)
```

(52) U.S. Cl.
CPC ........ *G06F 1/3296* (2013.01); *G06F 13/4068* (2013.01); *G06F 13/4282* (2013.01); *G11C 7/22* (2013.01); *Y02D 10/122* (2018.01); *Y02D 10/126* (2018.01); *Y02D 10/151* (2018.01)

(58) Field of Classification Search
USPC .................................................. 713/300–340
See application file for complete search history.

(56) References Cited

U.S. PATENT DOCUMENTS

| | | |
|---|---|---|
| 5,522,087 A | 5/1996 | Hsiang |
| 5,590,341 A | 12/1996 | Matter |
| 5,621,250 A | 4/1997 | Kim |
| 5,931,950 A | 8/1999 | Hsu |
| 6,748,546 B1 | 6/2004 | Mirov et al. |
| 6,792,392 B1 | 9/2004 | Knight |
| 6,823,516 B1 | 11/2004 | Cooper |
| 6,829,713 B2 | 12/2004 | Cooper et al. |
| 6,908,227 B2 | 6/2005 | Fusu et al. |
| 6,983,389 B1 | 1/2006 | Filippo |
| 6,996,728 B2 | 2/2006 | Singh |
| 7,010,708 B2 | 3/2006 | Ma |
| 7,043,649 B2 | 5/2006 | Terrell |
| 7,093,147 B2 | 8/2006 | Farkas et al. |
| 7,111,179 B1 | 9/2006 | Girson et al. |
| 7,146,514 B2 | 12/2006 | Kaushik et al. |
| 7,194,643 B2 | 3/2007 | Gonzalez et al. |
| 7,263,457 B2 | 8/2007 | White et al. |
| 7,272,730 B1 | 9/2007 | Acquaviva et al. |
| 7,412,615 B2 | 8/2008 | Yokota et al. |
| 7,434,073 B2 | 10/2008 | Magklis |
| 7,437,270 B2 | 10/2008 | Song et al. |
| 7,454,632 B2 | 11/2008 | Kardach et al. |
| 7,529,956 B2 | 5/2009 | Stufflebeam |
| 7,539,885 B2 | 5/2009 | Ma |
| 7,574,321 B2 | 8/2009 | Kernahan et al. |
| 7,596,464 B2 | 9/2009 | Hermerding et al. |
| 7,603,577 B2 | 10/2009 | Yamaji et al. |
| 7,624,215 B2 | 11/2009 | Axford et al. |
| 7,730,340 B2 | 6/2010 | Hu et al. |
| 7,752,467 B2 | 7/2010 | Tokue |
| 7,797,512 B1 | 9/2010 | Cheng et al. |
| 7,949,887 B2 | 5/2011 | Gunther et al. |
| 7,966,511 B2 | 6/2011 | Naveh et al. |
| 8,015,427 B2 | 9/2011 | Miller et al. |
| 8,370,551 B2 | 2/2013 | Ohmacht et al. |
| 8,381,004 B2 * | 2/2013 | Elnozahy ............. G06F 1/3203 713/321 |
| 8,407,319 B1 | 3/2013 | Chiu et al. |
| 8,601,288 B2 | 12/2013 | Brinks et al. |
| 8,631,262 B2 * | 1/2014 | Park ..................... G06F 1/3203 713/320 |
| 8,832,478 B2 | 9/2014 | Ananthakrishnan et al. |
| 2001/0044909 A1 | 11/2001 | Oh et al. |
| 2002/0194509 A1 | 12/2002 | Plante et al. |
| 2003/0061383 A1 | 3/2003 | Zilka |
| 2004/0030940 A1 | 2/2004 | Espinoza-Ibarra et al. |
| 2004/0064752 A1 | 4/2004 | Kazachinsky et al. |
| 2004/0098560 A1 | 5/2004 | Storvik et al. |
| 2004/0139356 A1 | 7/2004 | Ma |
| 2004/0268166 A1 | 12/2004 | Farkas et al. |
| 2005/0022038 A1 | 1/2005 | Kaushik et al. |
| 2005/0033881 A1 | 2/2005 | Yao |
| 2005/0046400 A1 | 3/2005 | Rotem |
| 2005/0132238 A1 | 6/2005 | Nanja |
| 2005/0223258 A1 | 10/2005 | Watts |
| 2005/0288886 A1 | 12/2005 | Therien et al. |
| 2006/0006166 A1 | 1/2006 | Chen et al. |
| 2006/0041766 A1 | 2/2006 | Adachi |
| 2006/0050670 A1 | 3/2006 | Hillyard et al. |
| 2006/0053326 A1 | 3/2006 | Naveh et al. |
| 2006/0059286 A1 | 3/2006 | Bertone et al. |
| 2006/0069936 A1 | 3/2006 | Lint et al. |
| 2006/0117202 A1 | 6/2006 | Magklis et al. |
| 2006/0184287 A1 | 8/2006 | Belady et al. |
| 2007/0005995 A1 | 1/2007 | Kardach et al. |
| 2007/0016817 A1 | 1/2007 | Albonesi et al. |
| 2007/0079294 A1 | 4/2007 | Knight |
| 2007/0101174 A1 | 5/2007 | Tsukimori et al. |
| 2007/0106428 A1 | 5/2007 | Omizo et al. |
| 2007/0106827 A1 | 5/2007 | Boatright et al. |
| 2007/0156992 A1 | 7/2007 | Jahagirdar |
| 2007/0168151 A1 | 7/2007 | Kernahan et al. |
| 2007/0214342 A1 | 9/2007 | Newburn |
| 2007/0234083 A1 | 10/2007 | Lee |
| 2007/0239398 A1 | 10/2007 | Song et al. |
| 2007/0245163 A1 | 10/2007 | Lu et al. |
| 2007/0260895 A1 | 11/2007 | Aguilar et al. |
| 2008/0005603 A1 | 1/2008 | Deep et al. |
| 2008/0028240 A1 | 1/2008 | Arai et al. |
| 2008/0028778 A1 | 2/2008 | Millet |
| 2008/0077282 A1 | 3/2008 | Hartman et al. |
| 2008/0077813 A1 | 3/2008 | Keller et al. |
| 2008/0136397 A1 | 6/2008 | Gunther et al. |
| 2008/0168287 A1 | 7/2008 | Berry et al. |
| 2008/0250260 A1 | 10/2008 | Tomita |
| 2008/0307240 A1 | 12/2008 | Dahan et al. |
| 2008/0316950 A1 | 12/2008 | Damnjanovic |
| 2009/0006871 A1 | 1/2009 | Liu et al. |
| 2009/0070605 A1 | 3/2009 | Nijhawan et al. |
| 2009/0150695 A1 | 6/2009 | Song et al. |
| 2009/0150696 A1 | 6/2009 | Song et al. |
| 2009/0158061 A1 | 6/2009 | Schmitz et al. |
| 2009/0158067 A1 | 6/2009 | Bodas et al. |
| 2009/0172375 A1 | 7/2009 | Rotem et al. |
| 2009/0172428 A1 | 7/2009 | Lee |
| 2009/0235105 A1 | 9/2009 | Branover et al. |
| 2009/0235108 A1 | 9/2009 | Gold et al. |
| 2009/0271141 A1 | 10/2009 | Coskun et al. |
| 2009/0271646 A1 | 10/2009 | Talwar et al. |
| 2009/0292935 A1 | 11/2009 | Hallnor et al. |
| 2009/0313489 A1 | 12/2009 | Gunther et al. |
| 2010/0058078 A1 | 3/2010 | Branover et al. |
| 2010/0115304 A1 | 5/2010 | Finkelstein et al. |
| 2010/0115309 A1 | 5/2010 | Carvalho et al. |
| 2010/0146513 A1 | 6/2010 | Song |
| 2010/0191997 A1 | 7/2010 | Dodeja et al. |
| 2010/0238693 A1 | 9/2010 | Jeddeloh |
| 2010/0250856 A1 | 9/2010 | Owen et al. |
| 2010/0332927 A1 | 12/2010 | Kurts et al. |
| 2011/0022865 A1 | 1/2011 | Gunther et al. |
| 2011/0072429 A1 | 3/2011 | Celeskey et al. |
| 2011/0093733 A1 | 4/2011 | Kruglick |
| 2011/0154090 A1 | 6/2011 | Dixon et al. |
| 2011/0283124 A1 | 11/2011 | Branover et al. |
| 2012/0053897 A1 | 3/2012 | Naffziger |
| 2012/0066535 A1 | 3/2012 | Naffziger |
| 2012/0096288 A1 | 4/2012 | Bates et al. |
| 2012/0110352 A1 | 5/2012 | Branover et al. |
| 2012/0114010 A1 | 5/2012 | Branch |
| 2012/0116599 A1 | 5/2012 | Arndt et al. |
| 2012/0173907 A1 | 7/2012 | Moses et al. |

(56) References Cited

U.S. PATENT DOCUMENTS

| | | | |
|---|---|---|---|
| 2013/0246825 A1 | 9/2013 | Shannon | |
| 2014/0146630 A1* | 5/2014 | Xie | G06F 1/32 365/226 |
| 2014/0324245 A1* | 10/2014 | Kwon | G06F 1/203 700/299 |

FOREIGN PATENT DOCUMENTS

| | | |
|---|---|---|
| CN | 101010655 B | 5/2010 |
| EP | 1 282 030 A1 | 5/2003 |
| KR | 10-2006-012846 | 12/2006 |
| TW | 200839497 | 10/2008 |
| TW | 200917694 | 4/2009 |
| TW | 201009567 | 3/2010 |
| TW | 201022923 | 6/2010 |
| TW | 201040701 | 11/2010 |
| TW | 201040962 | 11/2010 |
| TW | I342498 | 5/2011 |
| TW | 201120628 | 6/2011 |
| TW | I344793 | 7/2011 |

OTHER PUBLICATIONS

U.S. Appl. No. 12/889,121, "Providing Per Core Voltage and Frequency Control," filed Sep. 23, 2010, by Pakaj Kumar.
SPEC-Power and Performance, Design Overview V1.10, Standard Performance Information Corp., Oct. 21, 2008, 6 pages.
U.S. Appl. No. 13/070,700, "Obtaining Power Profile Information With Low Overhead," filed Mar. 24, 2011, by Robert Knight.
Anoop Iyer, et al., "Power and Performance Evaluation of Globally Asynchronous Locally Synchronous Processors," 2002, pp. 1-11.
Greg Semeraro, et al., "Hiding Synchronization Delays in A GALS Processor Microarchitecture," 2004, pp. 1-13.
Joan-Manuel Parcerisa, et al., "Efficient Interconnects for Clustered Microarchitectures," 2002, pp. 1-10.
Grigorios Magklis, et al., "Profile-Based Dynamic Voltage and Frequency Scalling for a Multiple Clock Domain Microprocessor," 2003, pp. 1-12.
Greg Semeraro, et al., "Dynamic Frequency and Voltage Control for a Multiple Clock Domain Architecture," 2002, pp. 1-12.
Greg Semeraro, "Energy-Efficient Processor Design Using Multiple Clock Domains with Dynamic Voltage and Frequency Scaling," 2002, pp. 29-40.
Diana Marculescu, "Application Adaptive Energy Efficient Clustered Architectures," 2004, pp. 344-349.
L. Benini, et al., "System-Level Dynamic Power Management," 1999, pp. 23-31.
Ravindra Jejurikar, et al., "Leakage Aware Dynamic Voltage Scaling for Real-Time Embedded Systems," 2004, pp. 275-280.
Ravindra Jejurikar, et al., "Dynamic Slack Reclamation With Procrastination Scheduling in Real-Time Embedded Systems," 2005, pp. 13-17.
R. Todling, et al., "Some Strategies for Kalman Filtering and Smoothing," 1996, pp. 1-21.
R.E. Kalman, "A New Approach to Linear Filtering and Prediction Problems," 1960, pp. 1-12.
Intel Technology Journal, "Power and Thermal Management in the Intel Core Duo Processor," May 15, 2006, pp. 109-122.
U.S. Appl. No. 13/285,414, filed Oct. 31, 2011, entitled "Controlling a Turbo Mode Frequency of a Processor," by Avinash N. Ananthakrishnan, et al.
U.S. Appl. No. 13/225,677, filed Sep. 6, 2011, entitled "Dynamically Allocating a Power Budget Over Multiple Domains of a Processor," by Avinash N. Ananthakrishnan, et al.
U.S. Appl. No. 13/247,580, filed Sep. 28, 2011, entitled "Controlling Temperature of Multiple Domains of a Multi-Domain Processor," by Avinash N. Ananthakrishnan, et al.
U.S. Appl. No. 13/285,465, filed Oct. 31, 2011, entitled "Dynamically Controlling Cache Size to Maximize Energy Efficiency," by Avinash N. Ananthakrishnan, et al.
U.S. Appl. No. 13/282,947, filed Oct. 27, 2011, entitled "Controlling Operating Frequency of a Core Domain via a Non-Core Domain of a Multi-Domain Processor," by Avinash N. Ananthakrishnan, et al.
U.S. Patent and Trademark Office, Office Action dated Jul. 31, 2014, in U.S. Appl. No. 13/247,564.
U.S. Patent and Trademark Office, Office Action dated Jan. 16, 2014, with Reply filed Apr. 9, 2014, in U.S. Appl. No. 13/247,564.
U.S. Patent and Trademark Office, Office Action dated Jun. 6, 2014, with Reply filed Sep. 4, 2014, in U.S. Appl. No. 13/282,947.
U.S. Patent and Trademark Office, Office Action dated May 16, 2014, with Reply filed Aug. 12, 2014, in U.S. Appl. No. 13/285,414.
U.S. Patent and Trademark Office, Final Office Action dated May 14, 2014, with Request for Continued Examination filed Aug. 13, 2014, in U.S. Appl. No. 13/247,580.
U.S. Patent and Trademark Office, Office Action dated Aug. 18, 2014, in U.S. Appl. No. 13/285,465.
David L. Hill, et al., "The Uncore: A Modular Approach to Feeding the High-Performance Cores," Intel Technology Journal, 2010, vol. 14, Issue 3, pp. 30-49.
International Searching Authority, "Notification of Transmittal of the International Search Report and the Written Opinion of the International Searching Authority," dated Mar. 28, 2013, in International application No. PCT/US2012/057655.
Taiwan Patent Office, Office action dated Aug. 21, 2014, in Taiwan application No. 101135884.
Taiwan Intellectual Property Office, First Office Action dated Jan. 8, 2018 in Taiwanese Patent Application No. 105140882. (Translation Redacted).

* cited by examiner

ENABLING A NON-CORE DOMAIN TO CONTROL MEMORY BANDWIDTH IN A PROCESSOR

This application is a continuation of U.S. patent application Ser. No. 15/138,505, filed Apr. 26, 2016, which is a continuation of U.S. patent application Ser. No. 14/451,807, filed Aug. 5, 2014, now U.S. Pat. No. 9,354,692, issued May 31, 2016, which is a continuation of U.S. patent application Ser. No. 13/282,896, filed Oct. 27, 2011, now U.S. Pat. No. 8,832,478, issued Sep. 9, 2014, the content of which is hereby incorporated by reference.

BACKGROUND

As technology advances in the semiconductor field, devices such as processors incorporate ever-increasing amounts of circuitry. Over time, processor designs have evolved from a collection of independent integrated circuits (ICs), to a single integrated circuit, to multicore processors that include multiple processor cores within a single IC package. As time goes on, ever greater numbers of cores and related circuitry are being incorporated into processors and other semiconductors.

Multicore processors are being extended to include additional functionality by incorporation of other functional units within the processor. One issue that arises is that the different circuitry can have differing needs with regard to frequency of operation based on their workloads. However, suitable mechanisms to ensure that these different units operate at an appropriate frequency are not available. Further, the different units can have a shared interface to access a shared cache or system memory. Typically, this interface to the cache and system memory is either operated at a constant fixed frequency or is tied to the frequency of the processor cores.

DETAILED DESCRIPTION

A multi-domain processor including multiple domains such as a core domain, a non-core domain and a system agent domain can enable the non-core domain to control memory bandwidth available to it. As will be described herein, in various embodiments this memory bandwidth can be realized by an interconnect structure, namely a ring interconnect that is part of the core domain. However, although described herein as being part of the core domain, understand that in other implementations a multi-domain processor can include an independent interconnect domain. By allowing a non-core domain to have control over an interconnect frequency and thus bandwidth, memory bandwidth used by non-core domain can be more efficient.

As will be discussed further below, in a multi-domain processor, a non-core domain can be coupled to a shared memory such as a last level cache and system main memory via an interconnect structure. By default, the interconnect frequency can be at the maximum frequency of all active cores of the core domain. If however the processor is power and/or thermally limited, the interconnect frequency drops along with the cores' frequency. Since the interconnect frequency impacts the effective memory bandwidth available to the non-core domain, the interconnect frequency has a significant impact on non-core domain performance. However, higher interconnect frequency comes at a cost of higher power consumption in the core domain. Embodiments may use a mailbox interface to dynamically optimize power/performance for a workload executing on a non-core domain.

In the particular implementation described herein, the non-core domain can be a graphics domain that includes one or more graphics engines. By enabling this domain to control its memory bandwidth via an interconnect to a memory hierarchy, performance of this domain can be improved, since particularly for a graphics workload performance is a strong function of bandwidth available to it. Although different manners of providing this control to the graphics domain are possible, embodiments described herein enable this ability by a mechanism that maps non-core domain frequency to a corresponding interconnect frequency. This mapping can be maintained in a table, which may be located in a power controller of the processor such as a power control unit (PCU). As will be described herein, this table can be configured during initialization by the non-core domain and furthermore, the table can be dynamically updated based on a workload being executed by the non-core domain. In this way, a close association between the workload being handled in the non-core domain and the bandwidth of the path to the memory subsystem can be achieved.

Figure 1:
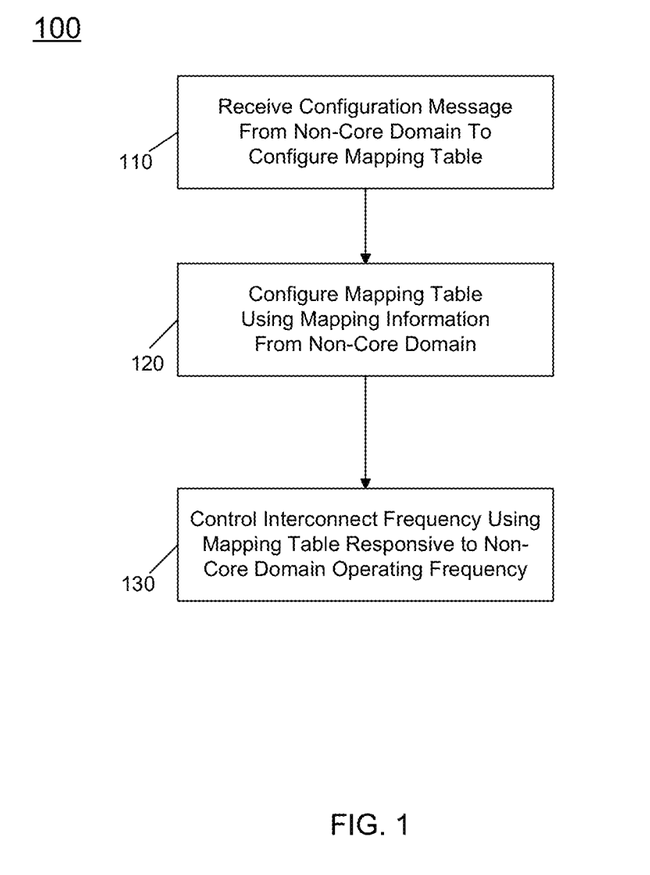
FIG. 1 is high level flow diagram of a method in accordance with an embodiment of the present invention.

Referring now to FIG. 1, shown is high level flow diagram of a method in accordance with an embodiment of the present invention. As shown in FIG. 1, method 100 can be performed by logic of the PCU, which can be the owner of the mapping table that associates non-core domain operating frequencies and corresponding interconnect operating frequencies. Namely, the table can map non-core domain frequency to a minimum interconnect frequency. However, the table data and initiation of table configuration and updates may be from another entity, such as a driver for the non-core domain. As seen, method 100 begins by receiving a configuration message from the non-core domain to configure a mapping table (block 110). This message may be received from a core of the core domain, as this driver may execute on a core. The receipt of information can be by way of a mailbox interface. This interface thus provides a mechanism for the driver to exchange parameters with the PCU. In one embodiment, a dedicated bus can be provided for communication between the driver and the PCU. In turn, the PCU can include a temporary storage area to store the incoming communications, and provide an interface to a mapping table in accordance with an embodiment of the present invention. In one embodiment this mailbox interface may enable the communication of table entries in serial fashion to thus populate the mapping table, which can be stored in a lookup table such as present in a memory of the PCU, e.g., random access memory (RAM). Next, at block 120 the mapping table can be configured using the mapping information received from the non-core domain. At this point the table entries have been written, and the PCU is now in position to control interconnect frequency based on the frequency at which the non-core domain is operating.

Accordingly, during normal operation control passes to block 130 where the interconnect frequency can be controlled using the mapping table. More specifically, responsive to the non-core domain operating frequency, which the PCU itself configures, a corresponding interconnect frequency is also configured. For example, when a graphics frequency changes, the PCU can use the updated graphics frequency value as an index into the table to access a table entry that includes a corresponding interconnect frequency for that graphics domain frequency. Accordingly, the PCU can take appropriate action to cause that interconnect frequency to be provided. As an example, the interconnect frequency can be changed by the same mechanism used to change core domain frequency, namely requesting core and non-core domains to pause generating cache bound or memory bound requests, draining the interconnect domain of all outstanding requests, effecting a frequency change and enabling the core and non-core domains to resume generating cache or memory traffic.

In the particular implementation described herein, note that the interconnect structure can be within the core domain and thus the core domain frequency itself is controlled. Note also that the frequency thus read from the table is a minimum frequency at which the interconnect is to operate and accordingly if the core domain is operating at a higher frequency than this value, the update to the interconnect frequency does not occur. And, when the processor is power/thermally limited, this frequency is not guaranteed. Further understand that in embodiments in which the interconnect frequency is also the operating frequency of the core domain, the PCU may select a maximum of the interconnect frequency from the appropriate mapping table entry and the core operating frequency requested by the operating system. Although shown at this high level in the embodiment of FIG. 1, understand the scope of the present invention is not limited in this regard.

As discussed above, the actual values stored in the mapping table can originate with the driver for the non-core domain. In one embodiment, this driver may include different tables, each associated with a particular type of workload to be executed on the non-core domain. These tables may include a base table that can be written to the mapping table in the PCU upon system initialization. However, due to changes in the workload, the table can be updated dynamically. This update may be to one or more values the table, or a complete update of the table to a new set of values can occur. Note that these different table configurations can be stored in connection with the driver, and each can be based on characterization testing of different workloads executing on the non-core domain. In a graphics domain example, different workload types can be different graphics resolution modes, 3D mode, multiple monitor configurations, and so forth. Also, different table entries may be provided depending on whether a gaming workload is performed (e.g., increasing interconnect frequency) or whether video playback on a portable device is executing (e.g., decreasing interconnect frequency) to reduce battery consumption.

Figure 2:
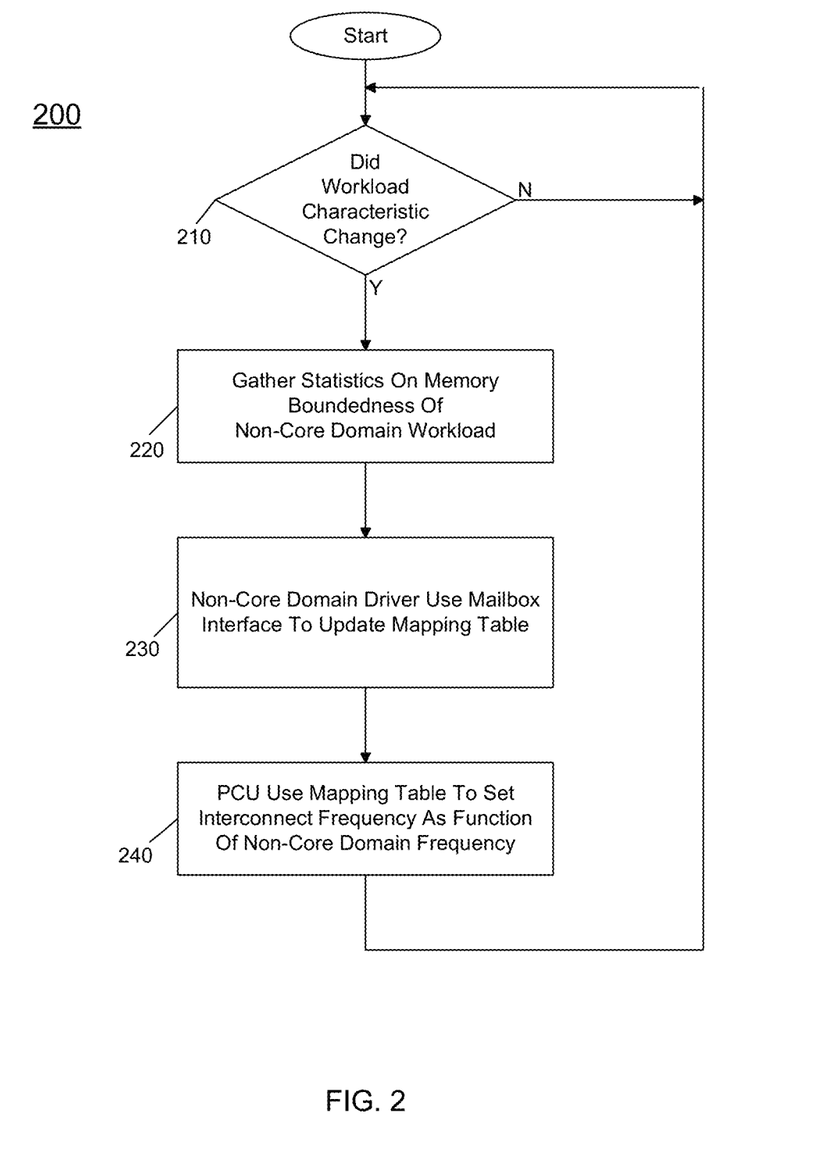
FIG. 2 is a flow diagram of a method for updating a mapping table in accordance with an embodiment of the present invention.

Referring now to FIG. 2, shown is a flow diagram of a method for updating a mapping table in accordance with an embodiment of the present invention. This method can be performed at least in part by a non-core domain driver or other software/firmware/logic that can be used to cause a mapping table to be set up for use in connection with interconnect frequency control. In the implementation described herein where the non-core domain is a graphics domain, the driver for the graphics domain may operate on a core of the core domain. As shown in FIG. 2, more generally method 200 may be performed by a driver for the non-core domain, along with logic of the PCU. In general, the flow of method 200 can be performing at a predetermined interval, e.g., approximately every 10 to 500 milliseconds (ms).

As seen, method 200 begins by determining whether a characteristic of a workload executing on the non-core domain has changed (diamond 210). If not, the remainder of the flow does not proceed for this iteration. Note that the analysis of the workload change may be based on a video mode being executed, e.g., video resolution, the presence of multiple monitors, a 3D mode, a type of media being played back, or so forth.

If instead it is determined at diamond 210 that the workload characteristic has changed, control passes to block 220. There, a determination may be made as to the memory boundedness of the workload (block 220). Although the scope of the present invention is not limited in this regard, in one embodiment the determination of memory boundedness can be based on statistics gathered for a given time interval as to the status of certain operations of the workload. For example, in one embodiment memory boundedness can be determined based on a number of misses from low level caches (e.g., of the non-core domain) that require access to a last level cache (LLC) or system memory. In other implementations, memory boundedness can be determined as a ratio with regard to the residency of outstanding loads from memory of instructions in an order buffer such as a memory order buffer (MOB) as compared to time spent in an active (e.g., a C0) state. Or the boundedness can be determined by a ratio of non-core domain read and write transactions on the memory interconnect to the total transactions. Memory boundedness can also be inferred by analyzing the number of memory read/write or commands being sent out to each of the memory modules.

This determination of memory boundedness can thus take some amount of time to obtain. Upon its completion, the driver can send an update for the mapping table to the PCU (block 230). In one embodiment, the driver can use the mailbox interface to update the mapping table. As discussed, this update can be to one or more (up to all) entries of the mapping table. For example, assume that the workload is memory bounded, the driver can cause updated values to be sent to the PCU to thus enable the table to be updated with increased interconnect frequency values for the same corresponding non-core domain frequency values. Accordingly, control passes to block 240, where the PCU can then use this updated mapping table to select an appropriate interconnect frequency for the corresponding non-core domain frequency. While described with this particular implementation in the embodiment of FIG. 2, understand the scope of the present invention is not limited in this regard.

As seen in the example of Table 1, the mapping table can include a plurality of entries each having two parameters namely non-core domain frequency and corresponding minimum interconnect frequency, which in the Table 1 embodiment may be in terms of megahertz (MHz). However in other embodiments the table can store entries that associate frequencies by ratios, offsets or so forth. In an embodiment, the non-core domain driver during run time can use the mailbox interface to set up this table in PCU memory. This configuration may be via specification of pairwise entries to identify a target interconnect frequency for a corresponding non-core domain frequency. Then after configuration, the PCU can access the table based on a frequency at which the non-core domain is operating to obtain the corresponding target interconnect frequency, and in turn control the core domain to operate at this frequency (assuming it is higher than the current operating frequency of the core domain). Note that when the core domain is operating at an increased frequency due to the non-core domain control, and the non-core domain thereafter enters into a sleep state, the PCU can update the core domain frequency to a lower, OS-requested level to reduce power consumption.

TABLE 1

| Table Entry | Non-Core Frequency | Minimum Interconnect Frequency |
|---|---|---|
| 1 | 300 | 800 |
| 2 | 350 | 800 |
| 3 | 400 | 800 |
| 4 | 450 | 800 |
| 5 | 500 | 800 |
| 6 | 550 | 800 |
| 7 | 600 | 800 |
| 8 | 650 | 1500 |
| 9 | 700 | 1500 |
| 11 | 750 | 1500 |
| 12 | 800 | 1500 |
| 13 | 850 | 1500 |
| 14 | 900 | 1800 |
| 15 | 950 | 1900 |
| 16 | 1000 | 2000 |
| 17 | 1050 | 2100 |
| 18 | 1100 | 2200 |
| 19 | 1150 | 2300 |
| 20 | 1200 | 2400 |
| 21 | 1250 | 2500 |
| 22 | 1300 | 2600 |

Figure 3:
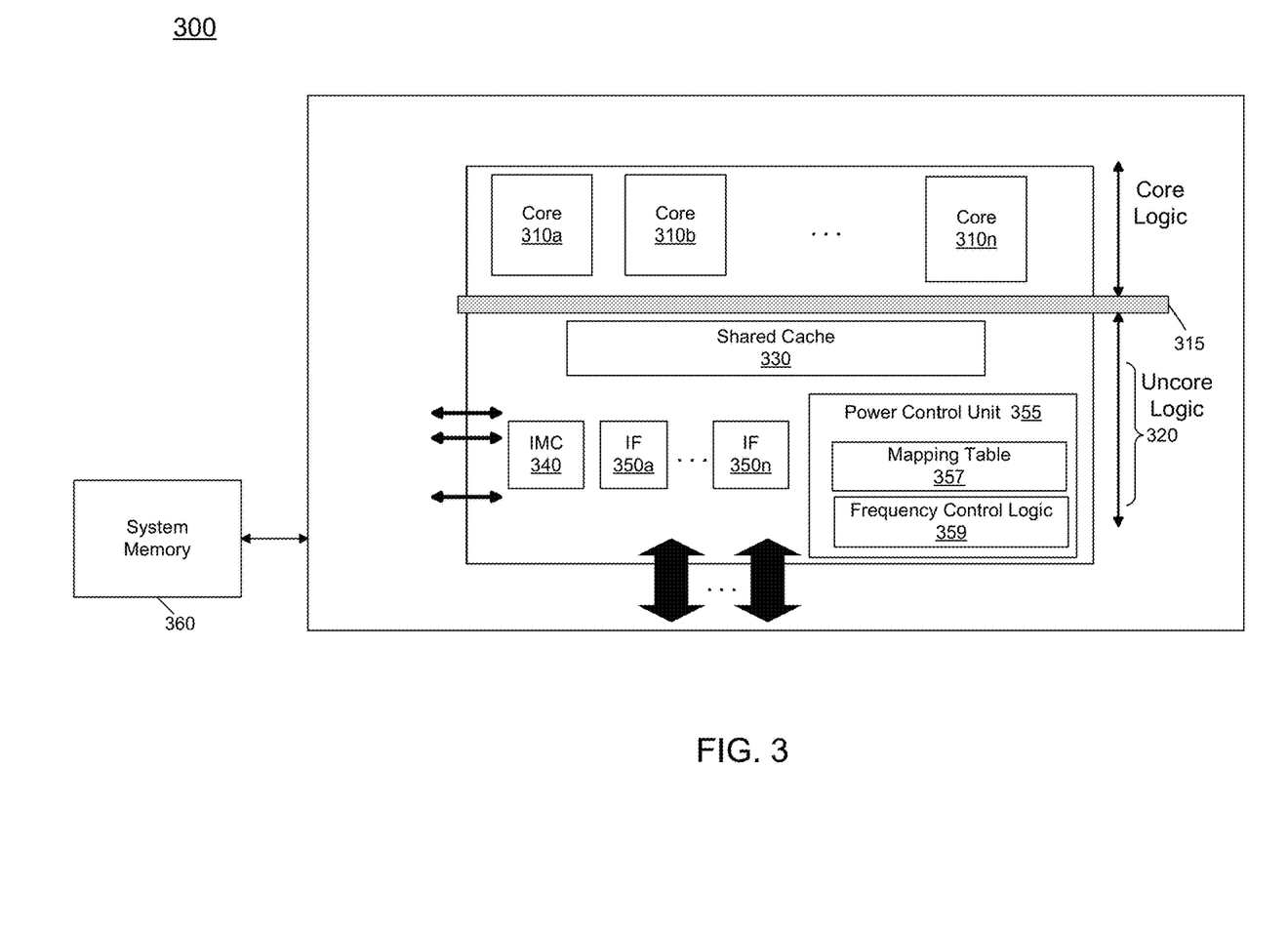
FIG. 3 is a block diagram of a processor in accordance with an embodiment of the present invention.

Referring now to FIG. 3, shown is a block diagram of a processor in accordance with an embodiment of the present invention. As shown in FIG. 3, processor 300 may be a multicore processor including a plurality of cores $310_a$-$310_n$. In one embodiment, each such core may be of an independent power domain and can be configured to operate at an independent voltage and/or frequency, and to enter turbo mode when available headroom exists. The various cores may be coupled via an interconnect 315 to a system agent or uncore 320 that includes various components. As seen, the uncore 320 may include a shared cache 330 which may be a last level cache. In addition, the uncore may include an integrated memory controller 340, various interfaces 350 and a power control unit 355.

In various embodiments, power control unit 355 may include a frequency control logic 359, which may be a logic to perform dynamic control of interconnect frequency responsive to a request of a given domain (which can be one of the core domains or a non-core domain). In the embodiment of FIG. 3, assuming that each core is of an independent power domain, logic 359 can control an interconnect frequency (where the interconnect can be of one of core domains) responsive to a request of a given domain, e.g., with reference to a mapping table 357. In some embodiments, each domain can have at least one mapping table with entries to associate a given domain frequency and a corresponding minimum interconnect frequency. In turn, each such domain can write its mapping table to mapping table 357, which may thus include multiple tables each associated with a given domain. Although shown at this location in the embodiment of FIG. 3, understand that the scope of the present invention is not limited in this regard and the storage of this information can be in other locations, such as configuration registers, non-volatile storage or the like.

With further reference to FIG. 3, processor 300 may communicate with a system memory 360, e.g., via a memory bus. In addition, by interfaces 350, connection can be made to various off-chip components such as peripheral devices, mass storage and so forth. While shown with this particular implementation in the embodiment of FIG. 3, the scope of the present invention is not limited in this regard.

Figure 4:
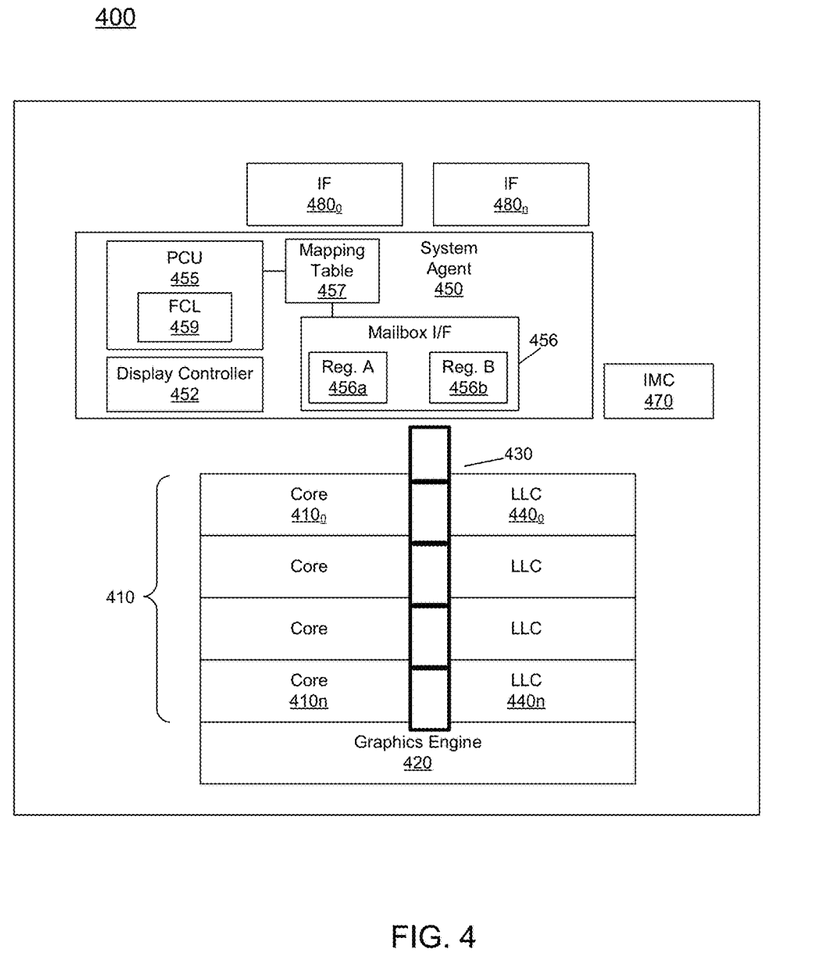
FIG. 4 is a block diagram of a multi-domain processor in accordance with another embodiment of the present invention.

Referring now to FIG. 4, shown is a block diagram of a multi-domain processor in accordance with another embodiment of the present invention. As shown in the embodiment of FIG. 4, processor 400 includes multiple domains. Specifically, a core domain 410 can include a plurality of cores $410_0$-$410_n$, a graphics domain 420 can include one or more graphics engines, and a system agent domain 450 may further be present. In various embodiments, system agent domain 450 may execute at a fixed frequency and may remain powered on at all times to handle power control events and power management such that domains 410 and 420 can be controlled to dynamically enter into and exit low power states. Each of domains 410 and 420 may operate at different voltage and/or power.

Note that while only shown with three domains, understand the scope of the present invention is not limited in this regard and additional domains can be present in other embodiments. For example, multiple core domains may be present each including at least one core.

In general, each core 410 may further include low level caches in addition to various execution units and additional processing elements. In turn, the various cores may be coupled to each other and to a shared cache memory formed of a plurality of units of a last level cache (LLC) $440_0$-$440_n$. In various embodiments, LLC 450 may be shared amongst the cores and the graphics engine, as well as various media processing circuitry. As seen, a ring interconnect 430 thus couples the cores together, and provides interconnection between the cores, graphics domain 420 and system agent circuitry 450. In one embodiment, interconnect 430 can be part of the core domain. However in other embodiments the ring interconnect can be of its own domain. In any event, the interconnect frequency can be controlled via system agent circuitry as described herein.

In the embodiment of FIG. 4, system agent domain 450 may include display controller 452 which may provide control of and an interface to an associated display. As further seen, system agent domain 450 may include a power control unit 455 which can include a frequency control logic 459 in accordance with an embodiment of the present invention to dynamically update the frequency of interconnect 430. In various embodiments, this logic may execute at least part of the algorithms shown in FIGS. 1 and 2 to dynamically control interconnect frequency. To this end, PCU 455 can be coupled to a mapping table 457, which may be a table configured as above to provide for association between a domain's frequency and a corresponding minimum interconnect frequency. Although the above embodiment of Table 1 shows table entries associating non-core domain frequency and minimum interconnect frequency, understand that multiple mapping tables may be present, each associated with a given domain of the processor and a corresponding minimum interconnect frequency.

To enable configuration of such table, which can be in a RAM of system agent domain 450, a mailbox interface 456 can be present. In general, interface 456 can include a first register 456a and a second register 456b. Such registers provide an interface for handshake-based communications between the PCU and other domains. In one embodiment, first register 456a can include a flag field to store a flag, a command field to store a command, and an address field to store an address, e.g., of an entry within mapping table 457. Second register 456b may be a data storage register. In one embodiment, graphics domain 420 can write an entry into a corresponding location within mapping table 457 by setting the flag field of first register 456a high, providing a write command for the command field, and providing an address corresponding to the entry in the table to be written to the address field, and further providing the data to be written to second register 456b. In turn, responsive to the active flag field, PCU 455 can thus write the data to the corresponding entry and reset the flag field to indicate to the graphics domain that it can write the next entry. While described with this particular protocol in the embodiment of FIG. 4, understand the scope of the present invention is not limited in this regard.

As further seen in FIG. 4, processor 400 can further include an integrated memory controller (IMC) 470 that can provide for an interface to a system memory, such as a dynamic random access memory (DRAM). Multiple interfaces $480_0$-$480_0$ may be present to enable interconnection between the processor and other circuitry. For example, in one embodiment at least one direct media interface (DMI) interface may be provided as well as one or more Peripheral Component Interconnect Express (PCI Express™ (PCIe™)) interfaces. Still further, to provide for communications between other agents such as additional processors or other circuitry, one or more interfaces in accordance with an Intel® Quick Path Interconnect (QPI) protocol may also be provided. Although shown at this high level in the embodiment of FIG. 4, understand the scope of the present invention is not limited in this regard.

Figure 5:
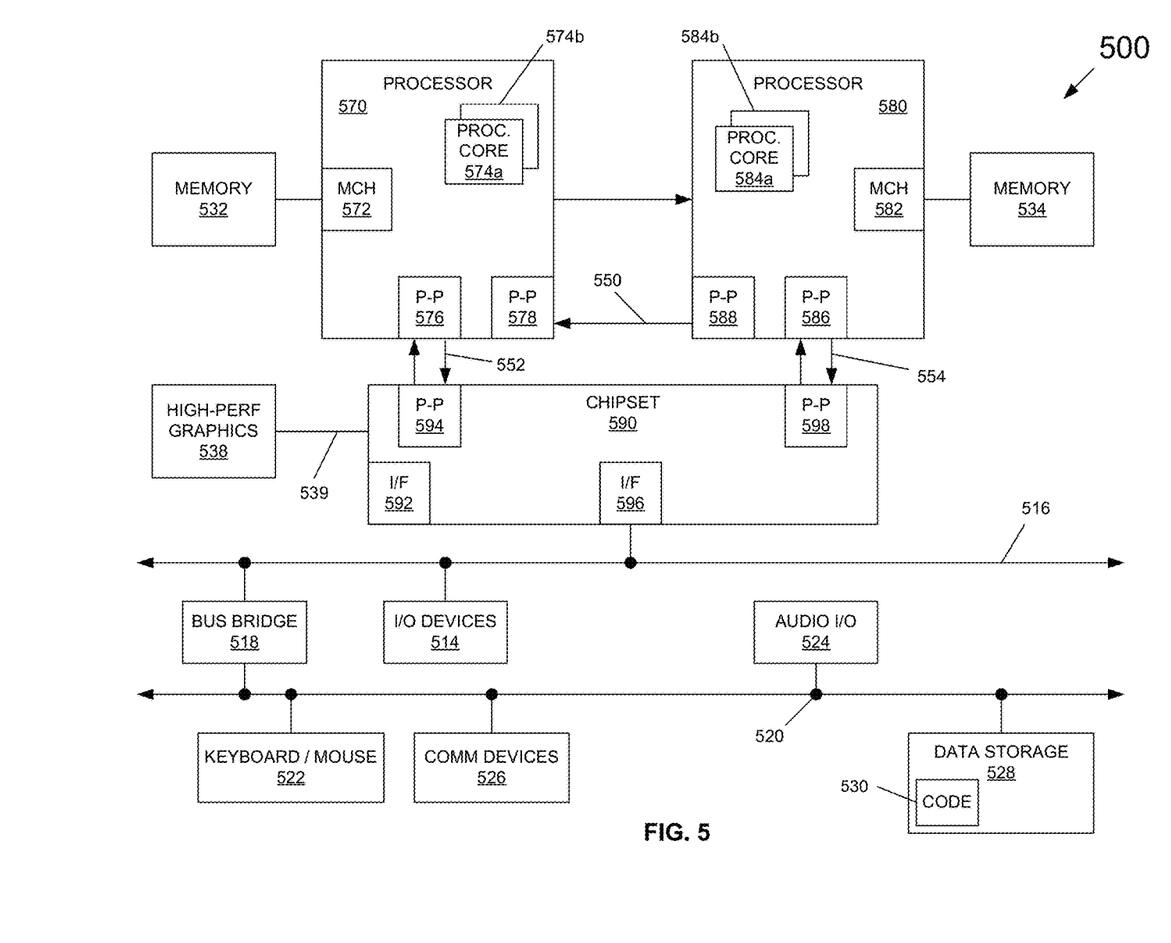
FIG. 5 is a block diagram of a system in accordance with one embodiment of the present invention.

Embodiments may be implemented in many different system types. Referring now to FIG. 5, shown is a block diagram of a system in accordance with an embodiment of the present invention. As shown in FIG. 5, multiprocessor system 500 is a point-to-point interconnect system, and includes a first processor 570 and a second processor 580 coupled via a point-to-point interconnect 550. As shown in FIG. 5, each of processors 570 and 580 may be multicore processors, including first and second processor cores (i.e., processor cores 574a and 574b and processor cores 584a and 584b), although potentially many more cores may be present in the processors. Each of the processors can include a PCU or other logic to perform dynamic control of an on-chip memory interconnect based on a non-core domain request, as described herein.

Still referring to FIG. 5, first processor 570 further includes a memory controller hub (MCH) 572 and point-to-point (P-P) interfaces 576 and 578. Similarly, second processor 580 includes a MCH 582 and P-P interfaces 586 and 588. As shown in FIG. 5, MCH's 572 and 582 couple the processors to respective memories, namely a memory 532 and a memory 534, which may be portions of system memory (e.g., DRAM) locally attached to the respective processors. First processor 570 and second processor 580 may be coupled to a chipset 590 via P-P interconnects 552 and 554, respectively. As shown in FIG. 5, chipset 590 includes P-P interfaces 594 and 598.

Furthermore, chipset 590 includes an interface 592 to couple chipset 590 with a high performance graphics engine 538, by a P-P interconnect 539. In turn, chipset 590 may be coupled to a first bus 516 via an interface 596. As shown in FIG. 5, various input/output (I/O) devices 514 may be coupled to first bus 516, along with a bus bridge 518 which couples first bus 516 to a second bus 520. Various devices may be coupled to second bus 520 including, for example, a keyboard/mouse 522, communication devices 526 and a data storage unit 528 such as a disk drive or other mass storage device which may include code 530, in one embodiment. Further, an audio I/O 524 may be coupled to second bus 520. Embodiments can be incorporated into other types of systems including mobile devices such as a smart cellular telephone, tablet computer, netbook, ultrabook, or so forth.

Embodiments may be implemented in code and may be stored on a non-transitory storage medium having stored thereon instructions which can be used to program a system to perform the instructions. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A mobile device comprising:
a processor;
memory coupled to the processor;
storage coupled to the processor; and
a display coupled to the processor;
wherein the processor comprises:
a plurality of cores of the processor, a first core of the plurality of cores to operate at a first voltage and a second core of the plurality of cores to operate at a second voltage, the second voltage independent of the first voltage;
the first core of the plurality of cores to be associated with a first frequency and the second core of the plurality of cores to be associated with a second frequency, wherein the first and second frequencies may be different from each other;
a graphics unit of the processor, wherein a driver of the graphics unit is to control execution on the graphics unit;
an interconnect of the processor to couple the first core of the plurality of cores, the second core of the plurality of cores and the graphics unit to a memory external to the processor; and
a power controller to control a frequency of the interconnect based at least in part on a frequency of the graphics unit, wherein the graphics unit is operable at a first plurality of frequencies and the interconnect is operable at a second plurality of frequencies, and the power controller is to update the frequency of the interconnect to another one of the second plurality of frequencies based at least in part on the frequency of the graphics unit.

2. The mobile device of claim 1, further comprising at least one communication device coupled to the processor.

3. The mobile device of claim 1, further comprising an audio input device coupled to the processor.

4. The mobile device of claim 1, further comprising an audio output device coupled to the processor.

5. The mobile device of claim 1, further comprising an input/output device coupled to the processor.

6. The mobile device of claim 1, wherein the mobile device comprises a cellular telephone.

7. The mobile device of claim 1, wherein the mobile device comprises a tablet computer.

8. The mobile device of claim 1, wherein the memory comprises random access memory.

9. The mobile device of claim 1, wherein the storage comprises a mass storage.

10. The mobile device of claim 5, wherein the input/output device comprises a keyboard.

11. A computing system comprising:
a processor;
memory coupled to the processor; and
storage coupled to the processor;
wherein the processor comprises:
   a plurality of cores of the processor, a first core of the plurality of cores to operate at a first voltage and a second core of the plurality of cores to operate at a second voltage, the second voltage independent of the first voltage;
   the first core of the plurality of cores to be associated with a first frequency and the second core of the plurality of cores to be associated with a second frequency, wherein the first and second frequencies may be different from each other;
   a graphics unit of the processor, wherein a driver of the graphics unit is to control execution on the graphics unit;
   an interconnect of the processor to couple the first core of the plurality of cores, the second core of the plurality of cores and the graphics unit to a memory external to the processor; and
   a power controller to control a frequency of the interconnect based at least in part on a frequency of the graphics unit, wherein the graphics unit is operable at a first plurality of frequencies and the interconnect is operable at a second plurality of frequencies, and the power controller is to update the frequency of the interconnect to another one of the second plurality of frequencies based at least in part on the frequency of the graphics unit.

12. The computing system of claim 11, further comprising at least one communication device coupled to the processor.

13. The computing system of claim 11, further comprising an input/output device coupled to the processor.

14. The computing system of claim 11, wherein the computing system comprises a server.

15. The computing system of claim 13, wherein the input/output device comprises a keyboard.

16. An apparatus comprising:
processor means for executing instructions;
memory means for storing first information, the memory means coupled to the processor means;
storage means for storing at least second information, the storage means coupled to the processor means; and
display means for displaying information, the display means coupled to the processor means, wherein the processor means comprises:
   a plurality of core means, a first core means of the plurality of core means for operating at a first voltage and a second core means of the plurality of core means for operating at a second voltage, the second voltage independent of the first voltage;
   the first core means of the plurality of core means to be associated with a first frequency and the second core means of the plurality of core means to be associated with a second frequency, wherein the first and second frequencies may be different from each other;
   a graphics means, wherein a driver means of the graphics means for controlling execution on the graphics means;
   an interconnect means for coupling the first core means, the second core means and the graphics means to a memory external to the apparatus; and
   a power control means for controlling a frequency of the interconnect means based at least in part on a frequency of the graphics means, wherein the graphics means is operable at a first plurality of frequencies and the interconnect means is operable at a second plurality of frequencies, and the power control means for updating the frequency of the interconnect means to another one of the second plurality of frequencies based at least in part on the frequency of the graphics means.

17. The apparatus of claim 16, further comprising at least one communication means coupled to the processor means.

18. The apparatus of claim 16, further comprising an audio input means coupled to the processor means.

19. The apparatus of claim 16, further comprising an audio output means coupled to the processor means.

20. The apparatus of claim 16, further comprising an input/output means coupled to the processor means.

* * * * *